(12) United States Patent
Wen

(10) Patent No.: US 8,123,918 B2
(45) Date of Patent: Feb. 28, 2012

(54) METHOD AND A SYSTEM FOR OPERATING A PHYSICAL VAPOR DEPOSITION PROCESS

(75) Inventor: Chia-Ling Wen, Yougkang (TW)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 1028 days.

(21) Appl. No.: 12/026,975

(22) Filed: Feb. 6, 2008

(65) Prior Publication Data
US 2008/0142360 A1 Jun. 19, 2008

Related U.S. Application Data

(62) Division of application No. 11/246,871, filed on Oct. 7, 2005, now Pat. No. 7,351,596.

(51) Int. Cl.
*C23C 14/35* (2006.01)
(52) U.S. Cl. .................. 204/298.03; 204/298.2
(58) Field of Classification Search ............. 204/298.03, 204/298.2
See application file for complete search history.

(56) References Cited

U.S. PATENT DOCUMENTS

| | | | |
|---|---|---|---|
| 4,500,408 A * | 2/1985 | Boys et al. ............... | 204/298.03 |
| 6,179,973 B1 | 1/2001 | Lai et al. | |
| 6,251,242 B1 | 6/2001 | Fu et al. | |
| 6,277,249 B1 | 8/2001 | Gopalraja et al. | |
| 6,352,629 B1 | 3/2002 | Wang | |
| 6,361,662 B1 * | 3/2002 | Chiba et al. ............... | 204/192.2 |
| 6,406,599 B1 | 6/2002 | Subramani et al. | |
| 6,730,196 B2 | 5/2004 | Wang et al. | |
| 6,841,050 B2 | 1/2005 | Hong et al. | |
| 7,022,209 B2 | 4/2006 | Sabisch et al. | |
| 7,351,596 B2 | 4/2008 | Wen | |
| 2006/0062686 A1 | 3/2006 | Pinter et al. | |
| 2006/0081458 A1 * | 4/2006 | Ford et al. ................. | 204/192.1 |
| 2006/0207872 A1 | 9/2006 | Mishin | |

OTHER PUBLICATIONS

Notice of Allowance for U.S. Appl. No. 11/246,871, mailed on Dec. 17, 2007, 4 pages.
Requirement for Restriction/Election for U.S. Appl. No. 11/246,871, mailed on Oct. 10, 2007, 5 pages.

* cited by examiner

*Primary Examiner* — Rodney McDonald
(74) *Attorney, Agent, or Firm* — Kilpatrick Townsend & Stockton LLP

(57) ABSTRACT

A method for fabricating semiconductor wafers using physical vapor deposition. The method includes maintaining a substrate on a susceptor in a chamber. The substrate has a face positioned within a vicinity of a target material, which is within the chamber. The target member comprises a first side and a second side. Preferably, the first side is positioned toward the face of the substrate. The method includes operating a magnet device fixed about a rotating member, which is coupled to the chamber and is coupled to a drive motor, which is coupled to a driver. A magnet device is positioned from a center region of the rotating member by a predetermined dimension. The method includes moving the magnet device in an annular manner about the center region using the rotating member. The magnet device is rotated at a velocity v and influences a spatial region, which is positioned overlying the second side of the target. The method also includes capturing information associated with an electromagnetic energy field associated with the moving magnet device at the velocity v. The method includes processing at least a portion of the information to determine if the electromagnetic energy field is within one or more predetermined parameters. The method transfers one or more signals to the driver to adjust the velocity of the moving magnetic device to cause a change to the electromagnetic energy field.

10 Claims, 5 Drawing Sheets

METHOD AND A SYSTEM FOR OPERATING A PHYSICAL VAPOR DEPOSITION PROCESS

CROSS-REFERENCES TO RELATED APPLICATIONS

This application is a divisional application of application Ser. No. 11/246,871, filed on Oct. 7, 2005, which claims priority to Chinese Application No. 200510030305.8; filed on Sep. 28, 2005; commonly assigned, and of which is hereby incorporated by reference for all purposes.

BACKGROUND OF THE INVENTION

The present invention is directed integrated circuits and their processing for the manufacture of semiconductor devices. More particularly, the invention provides a method and system for operating a physical vapor deposition process using active feedback control for the manufacture of semiconductor integrated circuit devices. But it would be recognized that the invention has a much broader range of applicability. For example, the invention can be applied to a variety of other applications such as displays, MEMS, or other applications.

Over the past decades, integrated circuits have evolved from a handful of interconnected devices fabricated on a single chip of silicon to millions of devices. Performance and complexity are far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits. Certain semiconductor devices are now being fabricated with features less than a quarter of a micron across.

Increasing circuit density has not only improved the complexity and performance of circuits but also provided lower costs to consumers. Conventional semiconductor fabrication plants often costs hundreds of millions or even billions of U.S. dollars to construct. Each fabrication facility has a certain capacity measured in tens of thousands of wafer starts per month. Each wafer also has a certain number of potential chips. By manufacturing individual devices smaller and smaller, more devices are packed in a given area of semiconductor, which increases output of the fabrication facility. Making devices smaller is always very challenging, as each process for the manufacture of semiconductor devices has a limit. That is to say, a given process typically only works down to a certain feature size, and then either the process or the device layout should be changed.

Costs of operating fabrication facilities have also increased dramatically. As many know, many U.S. fabrication facilities that were operable in the 1970's and 1980's no longer exist. Many of such fabrication facilities migrated to Japan in the 1980's and then to Korea and Taiwan in the 1990's. As demand for lower cost fabrication facilities continues, China has now become a choice geographic location for fabrication facilities to start up. Many companies have announced plans to begin manufacturing facilities in China. Such companies include, but are not limited to, Motorola, Inc., Taiwan Semiconductor Manufacturing Corporation of Taiwan, also called TSMC, and others. Although labor costs may be somewhat lower in China, there are still many costs that still need to be reduced or even eliminated as the demand for lower cost silicon continues!

An example of a process that has limitations is physical vapor deposition, commonly called PVD. PVD, which is also called sputtering, relies upon reactors that include a planar target of a metal to be sputtered in opposition to a wafer being coated. A working gas, typically argon, fills the chamber at low pressure. In DC sputtering, a negative voltage is applied to the target sufficient to discharge the argon into a plasma. The positive argon ions are attracted to the negatively biased target with sufficient energy that they sputter metal atoms from the target. Some of the sputtered metal atoms strike the wafer and coat it with a layer of the metal. In reactive sputtering, reactive gas is additionally filled into the chamber. The reactive gas reacts with the sputtered metal atoms at the surface of the wafer forming a metal nitride or other compound layer on the wafer surface. As devices become smaller, sputtered films require more uniformity, which is difficult to achieve using these conventional techniques. These and other limitations of the conventional PVD can be found throughout the present specification and more particularly below.

From the above, it is seen that an improved technique for processing semiconductor devices is desired.

BRIEF SUMMARY OF THE INVENTION

According to the present invention, techniques directed integrated circuits and their processing for the manufacture of semiconductor devices are provided. More particularly, the invention provides a method and system for operating a physical vapor deposition process using active feedback control for the manufacture of semiconductor integrated circuit devices. But it would be recognized that the invention has a much broader range of applicability. For example, the invention can be applied to a variety of other applications such as displays, MEMS, or other applications.

In a specific embodiment, the present invention provides a physical vapor deposition ("PVD") system. The system includes a PVD chamber and a susceptor in the chamber. A target material is within the chamber. Preferably, the target material comprises a first side and a second side, The first side is positioned toward a face of a substrate. A magnet device is fixed about a rotating member, which is coupled to the chamber and is coupled to a drive motor, which is coupled to a driver. The magnet device is positioned from a center region of the rotating member by a predetermined dimension. The magnet device is adapted to move in an annular manner about the center region using the rotating member. The magnet device is rotated at a velocity v and influences a spatial region. The spatial region positioned overlying the second side of the target. The system has a sensing device coupled to the magnet device. The sensing device is adapted to capture information associated with an electromagnetic energy field associated with the moving magnet device at the velocity v. A controller is coupled to the sensing device. Preferably, the controller is adapted to process at least a portion of the information to determine if the electromagnetic energy field is within one or more predetermined parameters. The controller is adapted to transfer one or more signals to the driver to adjust the velocity of the moving magnetic device to cause a change to the electromagnetic energy field.

In an alternative specific embodiment, the present invention provides a method for fabricating semiconductor wafers using physical vapor deposition. The method includes maintaining a substrate on a susceptor in a chamber. The substrate has a face positioned within a vicinity of a target material, which is within the chamber. The target member comprises a first side and a second side. Preferably, the first side is positioned toward the face of the substrate. The method includes operating a magnet device fixed about a rotating member, which is coupled to the chamber and is coupled to a drive motor, which is coupled to a driver. A magnet device is positioned from a center region of the rotating member by a predetermined dimension. The method includes moving the magnet device in an annular manner about the center region using the rotating member. The magnet device is rotated at a velocity v and influences a spatial region, which is positioned overlying the second side of the target. The method also includes capturing information associated with an electromagnetic energy field associated with the moving magnet device at the velocity v. The method includes processing at least a portion of the information to determine if the electromagnetic energy field is within one or more predetermined parameters. The method transfers one or more signals to the driver to adjust the velocity of the moving magnetic device to cause a change to the electromagnetic energy field.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention provides for more uniform films using physical vapor deposition. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques directed integrated circuits and their processing for the manufacture of semiconductor devices are provided. More particularly, the invention provides a method and system for operating a physical vapor deposition process using active feedback control for the manufacture of semiconductor integrated circuit devices. But it would be recognized that the invention has a much broader range of applicability. For example, the invention can be applied to a variety of other applications such as displays, MEMS, or other applications.

Figure 1:
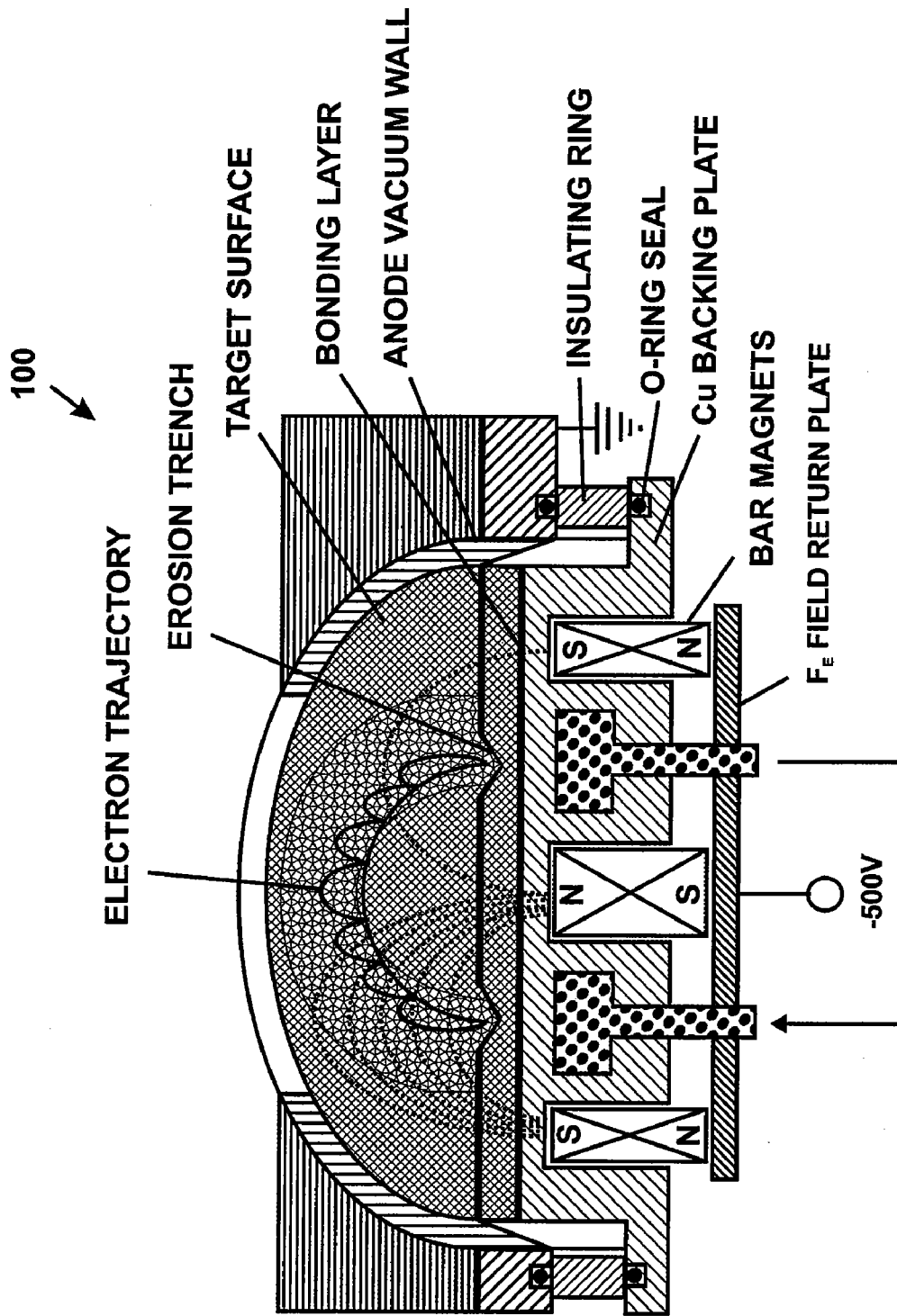
FIG. 1 is a simplified cross-sectional view diagram of a conventional PVD system.

FIG. 1 is a simplified cross-sectional view diagram of a conventional PVD system 100. As shown, the PVD system, which is widely used to deposit layers of metals and related materials in the fabrication of semiconductor integrated circuits, includes a planar target of the metal to be sputtered in opposition to the wafer being coated. A working gas, typically argon, fills the chamber at low pressure. In DC sputtering, a negative voltage is applied to the target sufficient to discharge the argon into a plasma. The positive argon ions are attracted to the negatively biased target with sufficient energy that they sputter metal atoms from the target. Some of the sputtered metal atoms strike the wafer and coat it with a layer of the metal. In reactive sputtering, most often of metal nitrides, nitrogen, oxygen, or other reactive gas is additionally filled into the chamber. The reactive gas reacts with the sputtered metal atoms at the surface of the wafer forming a metal nitride or other compound layer on the wafer surface.

As merely an example, multiple wiring levels representative of advanced integrated circuits include inter-level dielectric layers, typically of silicon dioxide or related silicate glass, separating neighboring pairs of generally horizontally extending electrical interconnects. Vias are electrical plugs extending vertically through the inter-level dielectric layers to interconnect the different wiring levels. A via is formed by etching a narrow hole through the exposed dielectric layer and then filling the holes with the metallization after a proper barrier or seed layer has been coated onto the sidewalls and bottom of the via hole. The increased capacity of advanced integrated circuits is achieved in large part by shrinking the horizontal dimensions of its elements.

Sputtering has been used to sputter aluminum for horizontal interconnections and to simultaneously fill via holes extending between metallization levels. Special sputtering techniques have been developed to deposit thin layers into narrow and deep vias to act as barrier and seed layers. Typical barrier materials include titanium, tantalum, tungsten, and their nitrides, all of which can be sputtered. Silicidation metals can also be sputtered. These layers need be only a few nanometers thick, but they must coat the sides of the via holes, a difficult but achievable process in sputtering. Copper is replacing aluminum in advanced integrated circuits for the metallization materials. Although most of the copper is deposited by electrochemical plating (ECP), a thin copper seed layer is required to initiate the ECP growth and to provide a plating electrode. Again, the copper seed layer must coat the side of the via holes.

Sputtering into high aspect-ratio holes is a difficult task since the sputtering process itself produces an approximately isotropic sputtering pattern. One general technique causes a large fraction of the sputtered metal atoms to be ionized. A negative electrical bias is applied to the pedestal electrode supporting the wafer being sputter coated to accelerate the metal ions to a high velocity perpendicular to the wafer so that they penetrate deeply within high aspect-ratio holes. Producing uniform sputter deposition is a challenge when the annular vaulted target and its magnetrons are distinctly non-uniform in the radial direction. Although certain improved process results have been achieved, further improvements are desired.

Figure 2:
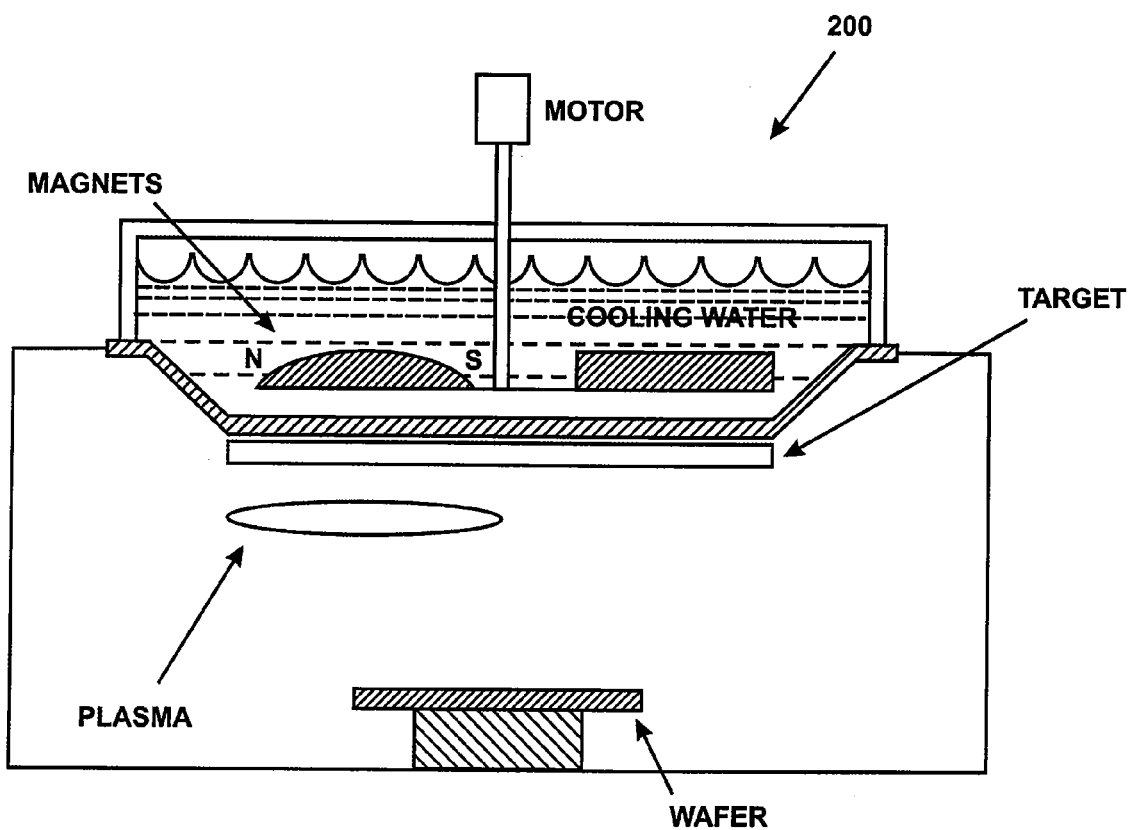
FIG. 2 is a simplified cross-sectional view diagram of the conventional PVD system.
Figure 3:
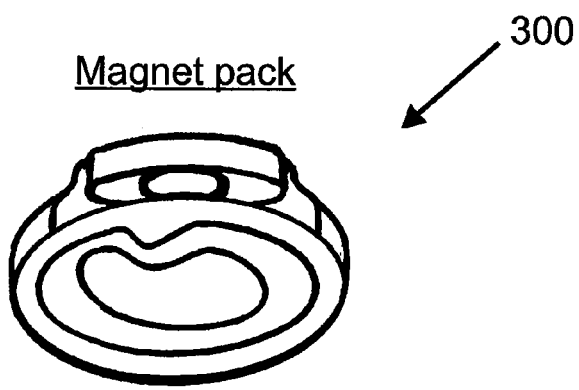
FIG. 3 is a simplified diagram of a magnet pack of the conventional PVD system.

As shown, a rotatable magnet 200 has been used to improve plasma efficiency, as illustrated by FIG. 2. The rotatable magnet is disposed about a rotatable axis, which is coupled to a drive motor. The rotatable magnet moves in an annular manner about a center region to improve the plasma efficiency. Unfortunately, such magnet movement often degrades with use, which causes inefficiencies in the plasma. Additionally, the magnet has a fixed rotation speed that cannot change to any changes in the plasma. Furthermore, the magnet pack 300 is often not symmetrical, which causes an unsymmetrical electromagnetic field, as illustrated by FIG. 3. These and other limitations have been discovered with the conventional PVD system. Depending upon the embodiment, one or more of these limitations may be overcome.

Figure 4:
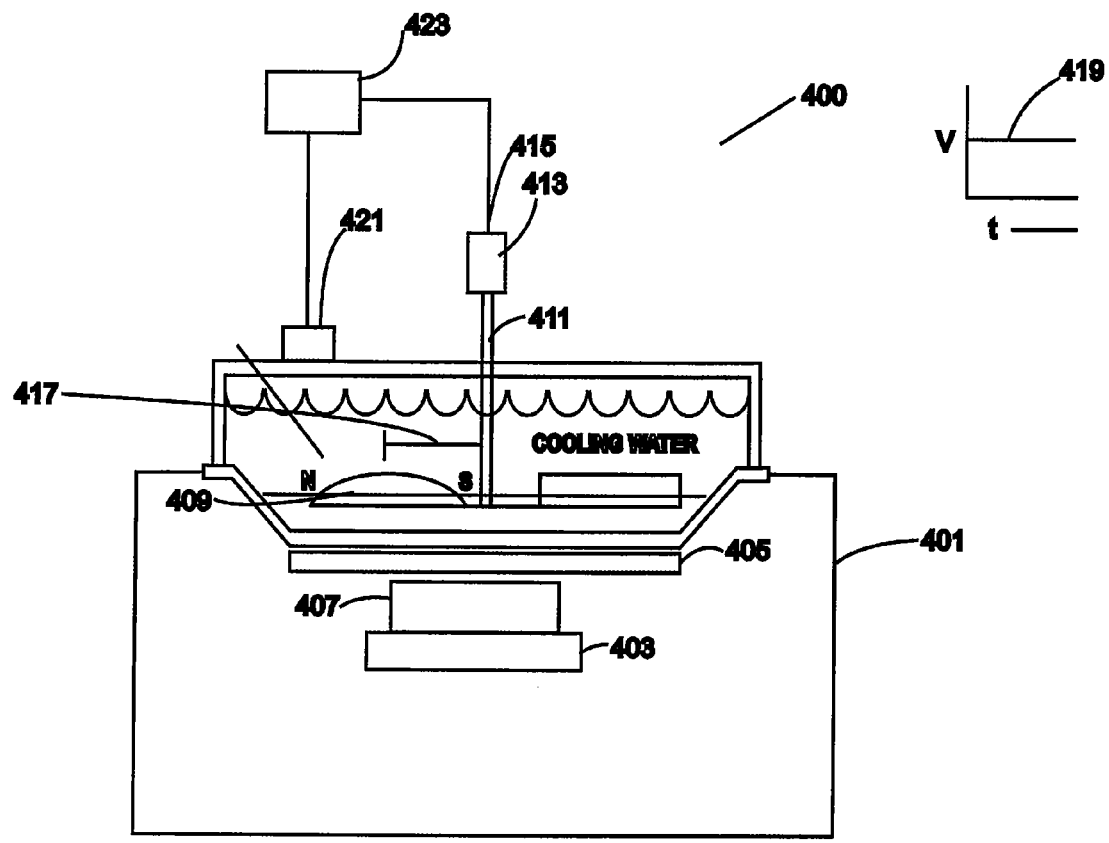
FIG. 4 is a simplified cross-sectional view diagram of a PVD system according to an embodiment of the present invention.

FIG. 4 is a simplified cross-sectional view diagram of a PVD system 400 according to an embodiment of the present invention. This diagram is merely an illustration, which should not unduly limit the scope of the claims herein. One of ordinary skill in the art would recognize many variations, modifications, and alternatives. As shown, the present invention provides a physical vapor deposition ("PVD") system. The system includes a PVD chamber 401 and a susceptor 403 in the chamber. A target material 405 is within the chamber. Preferably, the target material (e.g., aluminum, tungsten, titanium, copper) comprises a first side and a second side. The first side is positioned toward a face of a substrate 407. A magnet device 409 is fixed about a rotating member 411, which is coupled to the chamber and is coupled to a drive motor 413, which is coupled to a driver 415. The magnet device is positioned from a center region of the rotating member by a predetermined dimension 417. The magnet device is adapted to move in an annular manner about the center region using the rotating member. The magnet device is rotated at a velocity v 419 and influences a spatial region. The spatial region is positioned overlying the second side of the target.

As also shown, the system has a sensing device 421 coupled to the magnet device. Preferably, the sensing device is a magnetic detector, e.g., gauss meter. The sensing device is adapted to capture information associated with an electromagnetic energy field associated with the moving magnet device at the velocity v. A controller 423 is coupled to the sensing device. Preferably, the controller is adapted to process at least a portion of the information to determine if the electromagnetic energy field is within one or more predetermined parameters. The controller is adapted to transfer one or more signals to the driver to adjust the velocity of the moving magnetic device to cause a change to the electromagnetic energy field. Further details of the PVD system can be found throughout the present specification and more particularly below.

Figure 5:
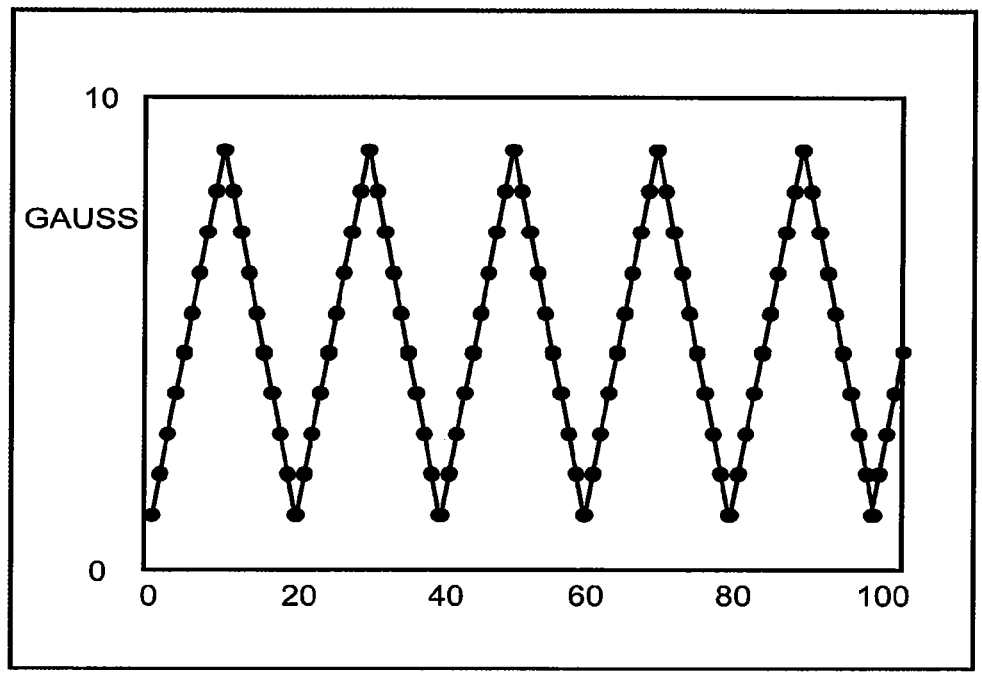
FIG. 5 is a simplified diagram of an electromagnetic field plotted against frequency according to an embodiment of the present invention.

FIG. 5 is a simplified diagram of an electromagnetic field plotted against frequency according to an embodiment of the present invention. This diagram is merely an illustration, which should not unduly limit the scope of the claims herein. One of ordinary skill in the art would recognize many variations, modifications, and alternatives. As shown, the magnetic field in Gauss has been plotted against frequency, cycles per time.

Figure 6:
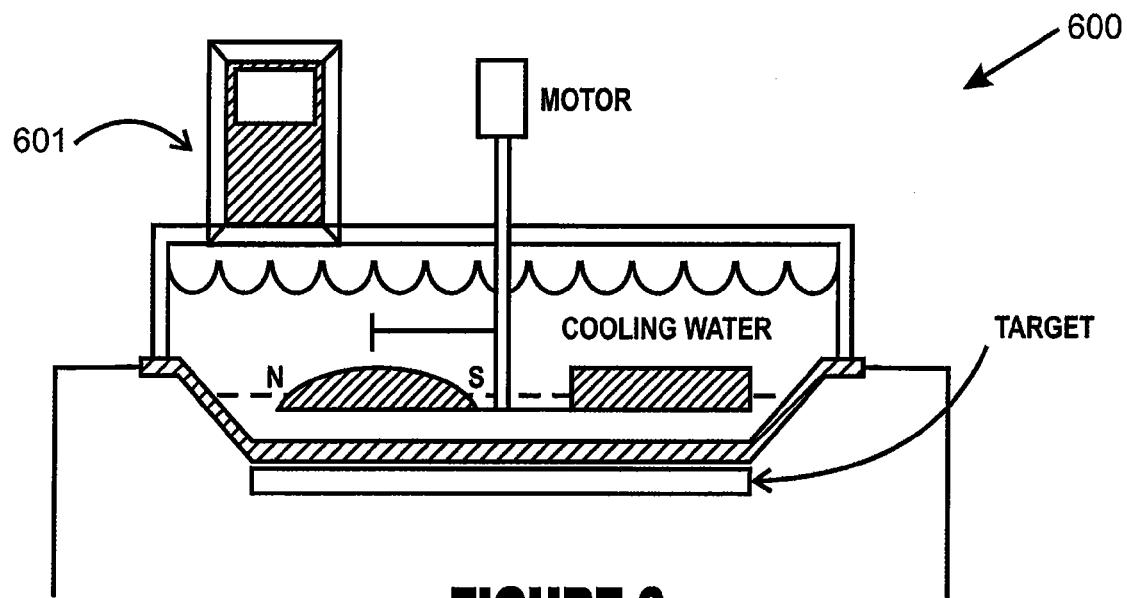
FIG. 6 is a simplified cross-sectional view diagram of a PVD system according to an alternative embodiment of the present invention.

FIG. 6 is a simplified cross-sectional view diagram of a PVD system 600 according to an alternative embodiment of the present invention. This diagram is merely an illustration, which should not unduly limit the scope of the claims herein. One of ordinary skill in the art would recognize many variations, modifications, and alternatives. As shown, the system includes a packaged detector and controller 601. The detector can be a Gauss meter, which captures the magnetic field information from an operating PVD chamber including movable magnet. The detector is coupled to the controller, which identifies the pattern of the magnetic field. Depending upon the pattern, the velocity of the drive motor can be increased, decreased, or maintained the same. The packaged meter and controller can be portable and coupled to any one of a plurality of PVD systems depending upon the embodiment. Of course, one of ordinary skill in the art would recognize many variations, modifications, and alternatives.

In an alternative specific embodiment, the present invention provides a method for fabricating semiconductor wafers using physical vapor deposition, which has been briefly outlined below.

1. Provide a substrate to be processed via PVD;
2. Maintain the substrate on a susceptor in a chamber and face the substrate toward a target material;
3. Operate a magnet device fixed about a rotating member, which is coupled to the chamber and is coupled to a drive motor, which is coupled to a driver;
4. Move the magnet device in an annular manner about a center region using the rotating member at a velocity v that influences a spatial region, which is overlying the target material;
5. Capture information associated with an electromagnetic energy field associated with the moving magnet device at the velocity v;
6. Process at least a portion of the information to determine if the electromagnetic energy field is within one or more predetermined parameters; and
7. Transfer one or more signals to the driver to adjust the velocity of the moving magnetic device to cause a change to the electromagnetic energy field.

The above sequence of steps provides a method according to an embodiment of the present invention. As shown, the method uses a combination of steps including a way of adjusting a velocity of a magnetic device coupled to a target for sputtering a film of material. Other alternatives can also be provided where steps are added, one or more steps are removed, or one or more steps are provided in a different sequence without departing from the scope of the claims herein. Further details of the present method can be found throughout the present specification and more particularly below.

Figure 7:
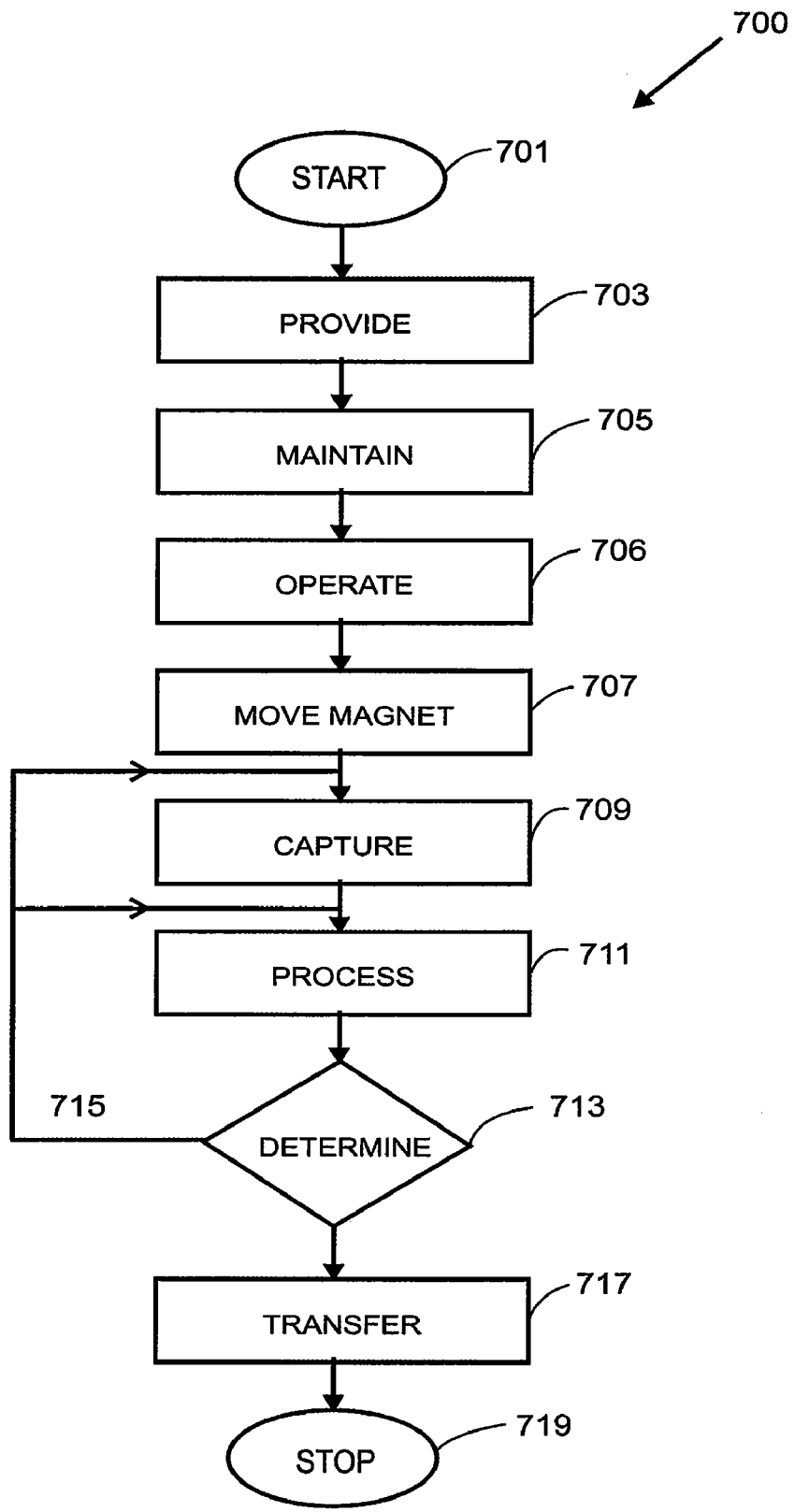
FIG. 7 is a simplified flow diagram of a PVD method according to an embodiment of the present invention.

FIG. 7 is a simplified flow diagram 700 of a PVD method according to an embodiment of the present invention. This diagram is merely an illustration, which should not unduly limit the scope of the claims herein. One of ordinary skill in the art would recognize many variations, modifications, and alternatives. A method for fabricating semiconductor wafers using physical vapor deposition is illustrated. The method begins with start, step 701. The method includes providing a substrate (step 703) to be processed for PVD. Preferably, the substrate is a silicon wafer, a silicon on insulator wafer or the like. The method includes maintaining (step 705) the substrate on a susceptor in a chamber, e.g., vacuum chamber. The substrate has a face positioned within a vicinity of a target material, which is within the chamber. The target member comprises a first side and a second side. Preferably, the first side is positioned toward the face of the substrate. Preferably, the target material can be any suitable species such as aluminum, copper, tungsten, titanium, and others.

The method includes operating (step 706) a magnet device fixed about a rotating member, which is coupled to the chamber and is coupled to a drive motor, which is coupled to a driver. A magnet device is positioned from a center region of the rotating member by a predetermined dimension. The method includes moving (step 707) the magnet device in an annular manner about the center region using the rotating member. The magnet device is rotated at a velocity v and influences a spatial region, which is positioned overlying the second side of the target. Preferably, the magnet device is maintained in a cooling liquid, e.g., water.

Next, the method also includes capturing (step 709) information associated with an electromagnetic energy field associated with the moving magnet device at the velocity v. Preferably, the energy is magnetic and captured via gauss meter or the like. The method includes processing (step 711) at least a portion of the information. The method determines (step 713) if the electromagnetic energy field is within one or more predetermined parameters. The one or more predetermined parameters can include a predetermined velocity for producing a uniform electromagnetic energy field. The method continues to capture the information, step 715. If the electromagnetic energy field is not within one or more of the predetermined parameters, the method may provide control to the process. Preferably, the method transfers (step 717) one or more signals to the driver to adjust the velocity of the moving magnetic device to cause a change to the electromagnetic energy field. Preferably, the change produces an electromagnetic energy field that is within the one or more predetermined parameters. The method continues to capture and monitor the velocity of the magnet device until it stops, step 719.

The above sequence of steps provides a method according to an embodiment of the present invention. As shown, the method uses a combination of steps including a way of adjusting a velocity of a magnetic device coupled to a target for sputtering a film of material. Other alternatives can also be provided where steps are added, one or more steps are removed, or one or more steps are provided in a different sequence without departing from the scope of the claims herein.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A PVD system, the PVD system comprising:
   a PVD chamber;
   a susceptor in the chamber;
   a target material within the chamber, the target material comprising a first side and a second side, the first side being positioned toward a face of a substrate;
   a magnet device fixed about a rotating member, the rotating member being coupled to the chamber and being coupled to a drive motor, the drive motor being coupled to a driver, the magnet device being positioned from a center region of the rotating member by a predetermined dimension, the magnet device being adapted to move in an annular manner about the center region using the rotating member, the magnet device being rotated at a velocity v and influencing a spatial region, the spatial region being positioned overlying the second side of the target;
   a sensing device coupled to the magnet device, the sensing device being adapted to capture information associated with an electromagnetic energy field associated with the moving magnet device at the velocity v;
   a controller coupled to the sensing device, the controller being adapted to process at least a portion of the information to determine if the electromagnetic energy field is within one or more predetermined parameters, the controller being adapted to transfer one or more signals to the driver to adjust the velocity of the moving magnetic device to cause a change to the electromagnetic energy field.

2. The system of claim 1 wherein the substrate is a silicon wafer.

3. The system of claim 1 wherein the sensing device comprises a gauss meter.

4. The system of claim 1 wherein the PVD chamber is provided for a physical deposition process.

5. The system of claim 1 wherein the one or more predetermined parameters is associated with a uniform electromagnetic energy field.

6. The system of claim 1 wherein the magnet device is maintained in a cooling liquid.

7. The system of claim 1 wherein the controller is a feedback controller.

8. The system of claim 1 wherein the velocity is a constant.

9. The system of claim 1 wherein a change in velocity is an increase in the velocity.

10. The system of claim 1 wherein the magnet device is a permanent magnet.

* * * * *